United States Patent [19]

Holonyak et al.

[11] 4,319,937
[45] Mar. 16, 1982

[54] HOMOGENEOUS LIQUID PHASE EPITAXIAL GROWTH OF HETEROJUNCTION MATERIALS

[75] Inventors: Nick Holonyak, Urbana, Ill.; Edward A. Rezek, West Los Angeles, Calif.

[73] Assignee: University of Illinois Foundation, Urbana, Ill.

[21] Appl. No.: 206,324

[22] Filed: Nov. 12, 1980

[51] Int. Cl.$^3$ .......................................... H01L 21/208
[52] U.S. Cl. .................................. 148/171; 148/172; 29/576 B
[58] Field of Search ....................... 148/171, 172, 173; 29/576 B

[56] References Cited

U.S. PATENT DOCUMENTS

| | | | |
|---|---|---|---|
| 3,958,263 | 5/1976 | Panish et al. | 148/171 X |
| 3,958,265 | 5/1976 | Charmakadze et al. | 148/171 X |
| 3,962,716 | 6/1976 | Petroff et al. | 148/171 X |
| 3,982,261 | 9/1976 | Antypas | 148/171 X |
| 3,995,303 | 11/1976 | Nahory et al. | 148/171 X |
| 4,072,544 | 2/1978 | DeWinter et al. | 148/171 |
| 4,149,914 | 4/1979 | Weyrich et al. | 148/172 X |
| 4,186,407 | 1/1980 | Delagebeandent et al. | 148/171 X |
| 4,233,090 | 11/1980 | Hawrylo et al. | 148/171 |
| 4,274,890 | 6/1981 | Varon | 148/171 |

*Primary Examiner*—G. Ozaki
*Attorney, Agent, or Firm*—David N. Koffsky; Jerome M. Teplitz; A. Sidney Alpert

[57] ABSTRACT

In accordance with the finding of undesired, non-uniform, heterojunction layers in heterojunction light emitters, it has been determined that completely uniform layers can be grown by growing individual super thin layers (i.e., $\leq 200$ Å) of uniform composition and stacking as many of these layers as desired into a uniform "thick" ($\sim 0.1\mu$) layer. This growth is accomplished by employing an LPE system wherein the substrate and melt are brought into contact for only the period of time during which the constituents of the melt deposit on the substrate in proper ratios. Steady-state diffusion-limited growth is avoided. The substrate is then removed from the melt, the melt allowed to re-equilibrate, and the process repeated as many times as desired.

4 Claims, 5 Drawing Figures

HOMOGENEOUS LIQUID PHASE EPITAXIAL GROWTH OF HETEROJUNCTION MATERIALS

This invention was developed in the course of work under grants from the National Science Foundation and Office of Naval Research.

BACKGROUND OF THE INVENTION

This invention relates to a method for growing semiconductor heterojunction devices and, more particularly, to a method for growing homogeneous materials in such devices.

The liquid phase epitaxial (LPE) method of crystal growth [H. Nelson, RCA Rev. 24, 603 (1963)] has been widely used to grow various homo- and heterostructure devices. Theoretical descriptions of the LPE crystal growth process are typically based on the assumption of thermodynamic equilibrium at the liquidus-solidus interface, and have been used to predict various first-order crystal growth properties (e.g., growth rate) with fairly good agreement with experimental data. These descriptions do not account, however, for any processes at the interface that may dominate the initial nonequilibrium phase of the growth process. Any anomalies during the first stage of LPE crystal growth have been hard to detect and have been comparatively unimportant, since most applications of LPE, until recently, have involved relatively thick layers ($\geq 0.1\mu m$). LPE growth initiation problems have become potentially more severe, however, with the decreasing dimensions characterizing contemporary devices and with the increasing variety of complicated alloys being grown, notably $In_{1-x}Ga_xP_{1-z}As_z$. Some difficulties related to initial growth kinetics have recently been reported, such as hetero-interface nonideality [M. Feng, L. W. Cook, M. M. Tashima, G. E. Stillman, and R. J. Blattner, Appl. Phys. Lett. 34, 697 (1979)] and compositional grading [R. J. Nelson, Appl. Phys. Lett. 35, 643 (1979)], but since conventional crystal growth techniques prohibit the study of processes occurring within the first few milliseconds of growth, such reports are more of a second-hand nature.

Four variations of the basic LPE process have been developed. In the supercooling technique, the substrate and the growth solution are cooled at a uniform rate to a temperature below the liquidus temperature ($T_l$) of the solution (but not enough to cause spontaneous precipitation of solute in the supercooled solution), then brought into contact with the substrate and cooled without interruption at the same rate until growth is terminated by wiping the solution off the substrate. In the step-cooling technique, the substrate and solution are cooled to a fixed temperature $T_l$, (again not enough for spontaneous precipitation), then brought into contact with the substrate and kept fixed in temperature until growth is terminated. The equilibrium-cooling technique employs the same cooling procedure as the supercooling technique, but the substrate and the solution are brought into contact as close to $T_l$ as possible, rather than below it. The two-phase-solution technique employs the same cooling procedure as the supercooling and equilibrium-cooling methods, but in this case the temperature is lowered far enough below $T_l$ for precipitation to occur before the substrate and solution are brought into contact. This technique May be regarded as an approximation to the equilibrium-cooling method, but it is complicated by the departure from equilibrium at the beginning of the growth and also by the deposition of the solute on the precipitates as well as on the substrate.

The LPE growth of binary, ternary, and quaternary III-V semiconductor alloys by either the step-cooling, equilibrium-cooling, or supercooling technique has been shown to be mainly controlled by diffusion of the solute in the column-III-element-rich liquidus solution toward the melt-substrate interface (i.e., diffusion-limited growth). The principal assumption made is that a state near thermodynamic equilibrium exists at the interface, implying that surface attachment kinetics are characterized by times much smaller than the growth period (typically no shorter than a few tenths of a minute). For relatively long growth times ($t \geq 1s$), the thickness of the epitaxial layers, as expected, is consistent with diffusion-limited theory. However, it has been found by us that for $t < 200ms$, the growth rate deviates significantly from diffusion-limited theory (but remains well-behaved). The usual conditions near the melt-substrate interface no longer apply, and other solute-depletion processes largely determine the growth rate. Nevertheless, Auger depth profiles of InGaPAs layers grown for $t < 200ms$ indicate no compositional grading in these epilayers. On the other hand, a comparison of the photoluminescence spectra of an InGaPAs layer grown for $t < 200ms$ ($\sim 18ms$) and a quaternary layer grown at the same temperature from a melt with the same liquidus composition for $t > 200ms$ ($\sim 1s$) clearly shows the recombination radiation energy of the two layers to be $\sim 15$ meV different.

Such experimental data present a strong case for the existence of two distinct LPE growth mechanisms during growth by the step-cooling technique.

In summary form, the following appears to be the explanation of what is happening during the growth of an active heterojunction layer. Assuming that a four-component melt is being utilized to create the active region (i.e., $In_{1-x}Ga_xP_{1-z}As_z$) and is being grown via LPE on an InP structure, the major component of the melt is In, with Ga, P, and As being at much lower concentrations. At the initial time of contact between the melt and substrate, all of the constituent components of the melt are in proportion and orderly growth of the active layer on the substrate commences. However, after a very short time (i.e., $>200ms$), the three minor components of the melt become depleted at the growth interface and their replenishment is limited by the diffusion times of those elements from more distant portions of the melt. (The In is not depleted because of its overwhelming quantity.) Thus until replenishment of the elements stabilizes into a steady-state (constant-slope) condition, there is a substantial variation of composition of the active layer with a resultant shift of the energy gap to a higher magnitude.

In devices employing such heterojunctions (i.e., lasers), the aforestated composition change dictates higher threshold currents and larger than desired power dissipations.

SUMMARY OF THE INVENTION

In accordance with our finding of the existence of undesired, non-uniform, heterojunction layers, we have determined that completely uniform layers can be grown by growing individual super thin layers (i.e., $\leq 200\text{Å}$) of uniform composition and stacking as many of these layers as desired into a uniform "thick" ($\sim 0.1\mu$) layer. This growth is accomplished by employing an LPE system wherein the substrate and melt are brought into contact for only the period of time during which the constituents of the melt deposit on the substrate in proper ratios. In other words, steady-state diffusion-limited growth is avoided. The substrate is then removed from the melt, the melt allowed to re-equilibrate, and the process repeated as many times as desired.

BRIEF DESCRIPTION OF THE DRAWINGS

FIG. 3 shows the emission spectra of a photopumped platelet cleaved from the double heterojunction of FIG. 2a.

DETAILED DESCRIPTION

Figure 1:
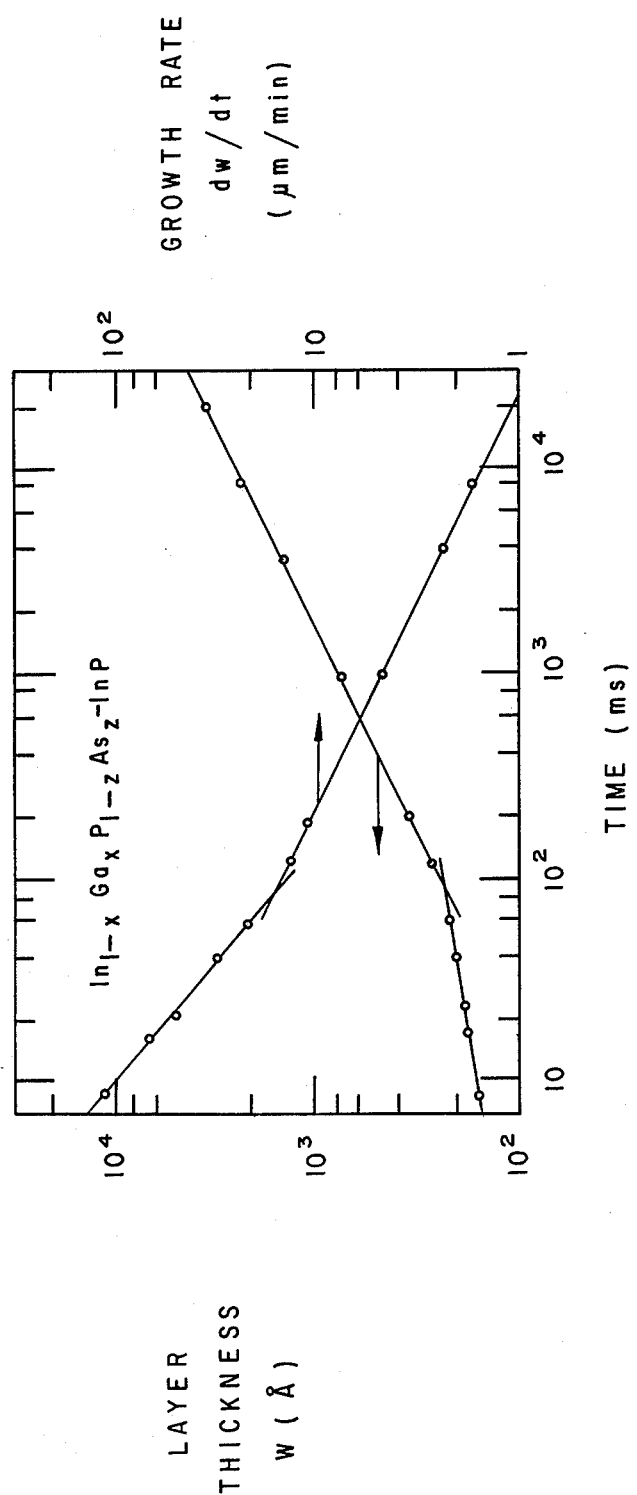
FIG. 1 is a log-log plot of the measured thickness (w) as a function of growth time (t) for LPE InGaPAs layers.

FIG. 1 shows a log-log plot of the measured thickness (w) as a function of growth time (t) for LPE $In_{1-x}Ga_xP_{1-z}As_z$ layers with a nominal $x \sim 0.13$, $z \sim 0.29$ composition. The quaternary layers were grown, using an automated growth apparatus for times ranging from $\sim 9ms$ to $\sim 20ms$; epitaxial layer thickness was measured with a Scanning Electron Microscope (SEM) using a cleaved and etched cross-section of the LPE wafer. For $t \sim 4s$ and longer, the quaternary layer thickness is at least $\sim 1200Å$, which is easily measured using an SEM. For $t \lesssim 1s$ the thickness of a single epitaxial layer is less than $\sim 800Å$, and an accurate determination of the thickness cannot be obtained in a straightforward manner with an SEM. Therefore, for $t \lesssim 1s$ the layer thickness was determined from a "composite" structure grown as described below. A Heathkit H8 was programmed with a repetitive growth cycle that places the InP substrate into contact with the InGaPAs melt for a short growth period, e.g., $\sim 9ms-1s$, during which time a single $\sim 150-180Å$ quaternary layer was grown. Growth was then terminated, and the InP substrate was rotated out of contact with any melt and was held there for a $\sim 400ms$ "waiting period" to allow the quaternary melt to re-equilibrate. This was followed by another short-interval growth (same growth time) from the same (re-equilibrated) InGaPAs melt. This sequence was repeated until a measurably thick "composite" structure was grown, one thin layer at a time. The quaternary layers used to generate the thickness vs. time data of FIG. 1 were composed of 9 individual short-interval growths. Therefore, for $t \lesssim 1s$, the data of FIG. 1 represent the average thickness of the layers. The data was compiled at a growth temperature of 634° C. using a fixed 10° C. of supersaturation.

FIG. 1 shows that for growth times less than 100ms, the InGaPAs alloy is growing by a non-diffusion-limited process. For growth times greater than 200ms (i.e., steady-state), the growth process is diffusion-limited. For growth times between 100 and 200ms, both processes appear to be present. Roughly 220-250 Angstroms can be deposited under non-diffusion-limited conditions. However, by the time a layer approximately 300 Angstroms thick is deposited, the growth is definitely dominated by the diffusion of the solutes toward the growth interface. In summary, this indicates the existence of a transition from diffusion-limited growth known to occur at long growth times (>1s) to a transient growth where kinetic processes dominate the crystal growth at short intervals (<100ms). Also, the behavior of the growth rate for t<200ms markedly changes.

It should be clear that the aforesaid limits regarding diffusion-limited and non-diffusion-limited growth, transition times, and layer thickness will vary somewhat under different growth conditions, e.g., growth temperature. But the same general behavior for liquid phase epitaxial growth is to be fully expected from other multi-component alloys.

Figure 2:
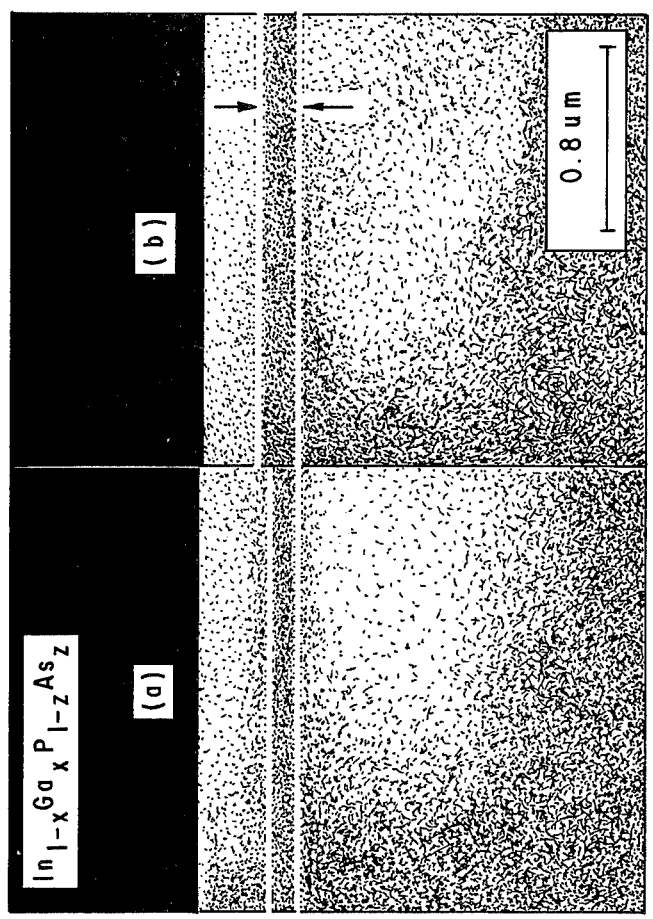
FIG. 2a is a reproduction of a microphotograph of a standard double heterojunction with an 800Å InGaPAs layer deposited during one second of uninterrupted growth.
FIG. 2b is a reproduction of a microphotograph of a double heterojunction grown in accordance with the invention.

A comparison of a double heterostructure (DH) with a single InGaPAs layer active region and a "composite" active region consisting of a stack of 9 InGaPAs layers grown for $\sim 18ms$ is shown in FIG. 2. FIG. 2a shows a standard DH with the $\sim 800Å$ InGaPAs layer deposited during $\sim 1s$ of uninterrupted growth. The quaternary active region between the arrows of FIG. 2b is a stack composed of 9 distinct LPE layers grown ($\sim 18ms$ each) from the same melt. The liquidus compositions of the melts used to grow the active regions in FIG. 2 were identical. The layers appeared to be a single layer, and no boundaries were evident.

Figure 3:
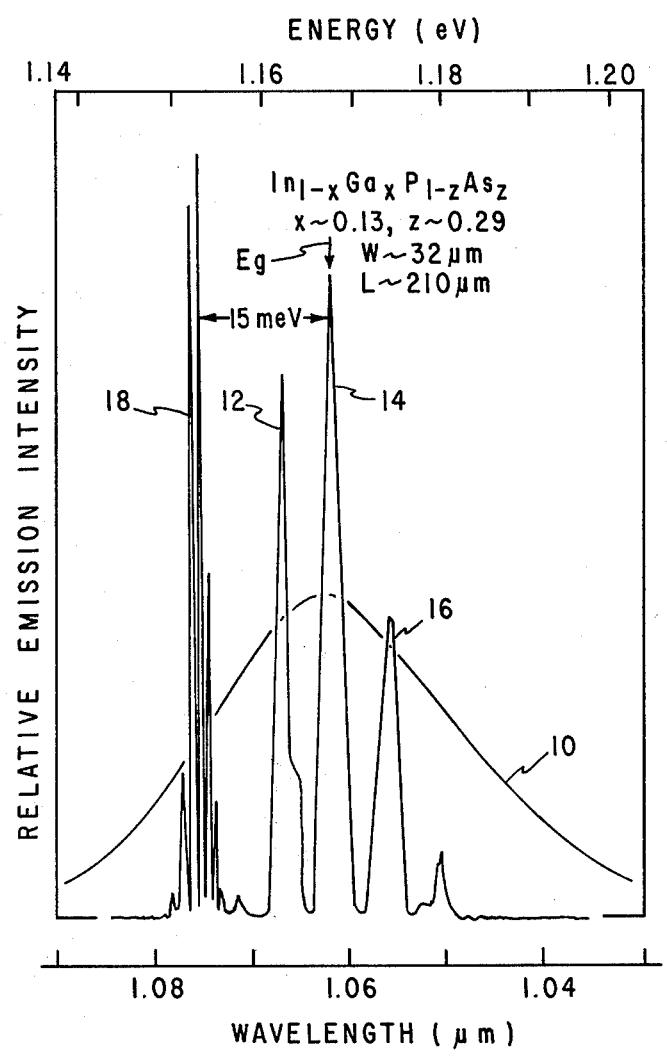

FIG. 3 shows the emission spectra (77 K) of a photo-pumped platelet cleaved from the standard, undoped, DH wafer of FIG. 2a with an $\sim 800Å$ InGaPAs active region grown for $\sim 1s$. The platelets are cleaved into rectangular samples, giving 4 Fabry-Perot faces and two independent, orthogonal laser oscillation paths. The low level spontaneous emission background, curve 10, is centered at $\lambda \sim 1.06 \mu m$. At the higher excitation level, laser operation occurs as expected at $\lambda \sim 1.06 \mu m$ across the width of the sample (widely spaced modes 12, 14, and 16) and simultaneously along the sample length (narrowly spaced modes 18) at $\lambda \sim 1.075 \mu m$, or $\sim 15$ meV below $E_g$.

It is clear that the lower energy emission modes 18 are due to a different process. The existence of compositional grading over the entire extent of the $\sim 800Å$ layer is not the responsible process because it would shift the spontaneous peak 10 to lower energy, which is not observed. Similarly, melt carry-over or substrate dissolution prior to LPE growth could not explain the data of FIG. 3 since either would form a quaternary layer of higher-energy composition (more InP-like) than the equilibrium composition. This would cause the spontaneous peak to shift to higher energy, which is not observed. Alloy disorder could account for the data of FIG. 3 but is a finer scale effect and would not necessarily lead to a separation in laser lines of $\Delta E \sim 15$ meV. As indicated in FIG. 1 and in the discussion relating to it, the LPE process for short growth times is controlled by an entirely different mechanism than the diffusion-limited process characteristic of longer growth times. Hence, the data indicate that the responsible agent for the inhomogeneous photoluminescence spectra of FIG. 3 is the "non-equilibrium" LPE crystal growth that occurs in the first few milliseconds of the LPE process.

These data lead to the following conclusions. During the usual 1 second of uninterrupted step-cooled LPE growth of InGaPAs, two processes actually occur. Immediately after the substrate is placed into contact with the quaternary melt, an extremely rapid, non-steady-state, "non-equilibrium" process deposits a thin InGaPAs layer of constant composition. At this time, there is either a deficiency of some of the liquidus components, or an accumulation of others, or both, at the melt-substrate interface. The initial LPE layer is only $\sim 100$Å thick because of this non-steady-state condition. The LPE growth continues when a steady-state diffusion profile and near-equilibrium conditions are established, i.e., as the liquidus components diffuse within the melt and form a steady-state diffusion profile. For the remaining portion of the growth period, the InGaPAs layer grows by the diffusion-limited near-equilibrium process. The net effect in the case of the growth of a thick LPE InGaPAs layer is that actually two layers are formed, one thicker and one thinner, and differing slightly in composition with an energy gap difference of $\sim 15$ meV.

To verify the supposition above by measurements, "composite" (stacked) structures as described above and shown in FIG. 2b were grown. Specifically, the growth equipment was programmed with a growth cycle that places the InP substrate into contact with the InGaPAs melt for $\sim 18$ms between $\sim 400$ms "melt re-equilibration periods". A total of 9 InGaPAs layers were grown.

Figure 4:
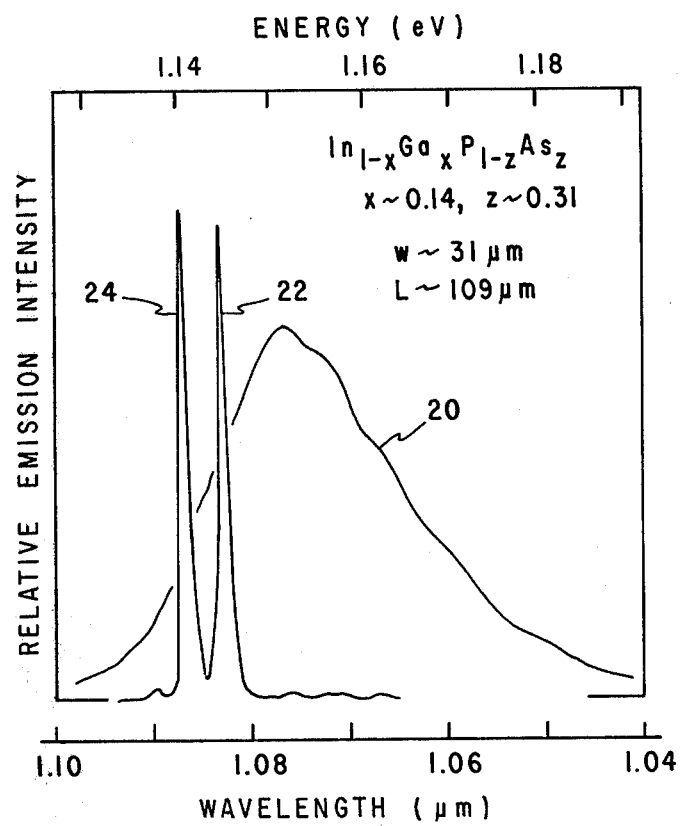
FIG. 4 shows the emission spectra of a photopumped platelet cleaved from the double heterojunction of FIG. 2b.

Emission spectra (77 K) obtained on a rectangular sample of the wafer of FIG. 2b are shown in FIG. 4. The low-level spontaneous radiation 20 is not centered at $\lambda \sim 1.06$ μm corresponding to the lattice-matched $In_{1-x}Ga_xP_{1-z}As_z$ ($x \sim 0.13$, $z \sim 0.29$) solidus in equilibrium with the particular liquidus composition, but is centered at $\lambda \sim 1.075$ μm, corresponding to an $In_{1-x}Ga_xP_{1-z}As_z$ layer of composition ($x \sim 0.14$, $z \sim 0.31$). This recombination radiation energy is $\sim 15$ meV lower than that of the spontaneous emission peak of the single $\sim 800$Å layer of FIGS. 2a and 3, and is identical, moreover, to the energy of the downshifted end-to-end laser modes 18 of the first structure. At higher pumping level, laser operation modes 22 and 24 of the 9-layer quaternary stack of FIG. 2b occur on the lower energy side of the spontaneous peak 20 at $\lambda \sim 1.085$ μm. Laser oscillation is observed only across the sample width; no end-to-end lower energy emission was exhibited by any of the numerous samples examined. Together with the more narrow spontaneous emission line-width 20 and the laser modes 22 and 24, data indicate that the compositional inhomogeneity present in the active region of the sample of FIGS. 2a and 3 has been removed. In other words, LPE quaternary material of FIG. 2b has a smaller energy gap and is more uniform in composition than that grown under "equilibrium" conditions for a greater time and thickness.

Figure 5:
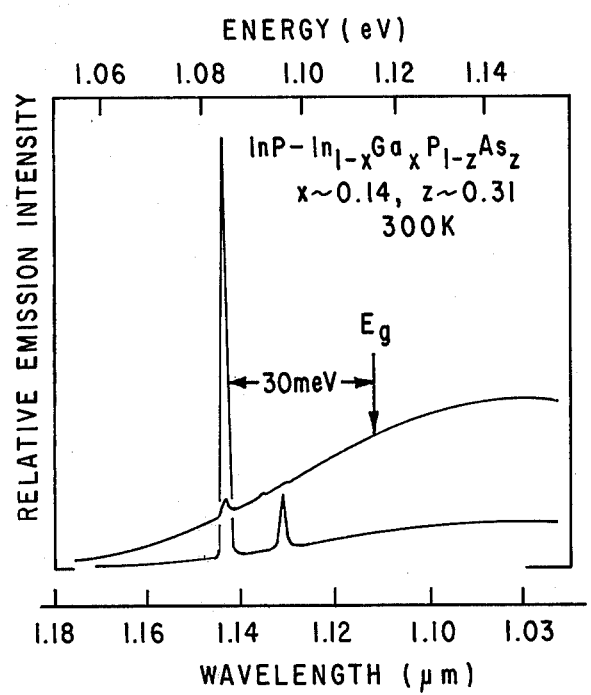
FIG. 5 shows the emission spectra of a photopumped laser constructed in accordance with the invention.

Turning now to FIG. 5, a continuous (CW) 300 K photopumped laser of composite InP-InGaPAs-InP structure similar to that of FIG. 2b was constructed. Nine $In_{1-x}Ga_xP_{1-z}As_z$ ($x \sim 0.14$, $z \sim 0.31$) layers, each grown for $\sim 60$ms, formed a $\sim 2000$Å active region for the structure. The equivalent threshold current density was found to be $\sim 700$ A/cm$^2$, essentially equal to the best state-of-the-art injection lasers in this alloy system. This structure was not optimized for low threshold operation—the Fabry-Perot cavity of this particular rectangular platelet was $\sim 19.5$ μm long, resulting in an end loss $\sim 20$ times larger than that of a typical $\sim 380$ μm long diode. Therefore even lower threshold current densities are to be expected in optimized devices. It is, however, clear from the results that unwanted higher energy oscillation modes have been eliminated through the use of the method heretofore described for producing homogeneous active regions.

We claim:
1. A method for producing a homogeneous semiconductor layer upon a lattice matched semiconductor material substrate, comprising:
    contacting said substrate with a melt of said semiconductor layer for a period of time which is less than the time required for steady-state diffusion-limited growth of said semiconductor layer to be established;
    removing said substrate from contact with said melt for a time sufficient to allow the constituent components of said melt to re-equilibrate; and
    repeating said contacting and removing steps a sufficient number of times to achieve a desired thickness of said semiconductor layer on said substrate.
2. The method as defined in claim 1 wherein said melt is an alloy of semiconductor materials.
3. The method as defined in claim 2 wherein said melt is comprised of $In_{1-x}Ga_xP_{1-z}As_z$.
4. The method as defined in claim 3 wherein said substrate is contacted with said melt for no longer than 200ms at a time.

* * * * *